United States Patent
Ning (10) Patent No.: US 9,178,046 B2
(45) Date of Patent: Nov. 3, 2015

(54) ARRAY SUBSTRATE AND MANUFACTURING METHOD THEREOF

(71) Applicant: BOE TECHNOLOGY GROUP CO., LTD., Beijing (CN)

(72) Inventor: Ce Ning, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 92 days.

(21) Appl. No.: 13/703,112

(22) PCT Filed: Sep. 26, 2012

(86) PCT No.: PCT/CN2012/081997
§ 371 (c)(1),
(2) Date: Dec. 10, 2012

(87) PCT Pub. No.: WO2013/044796
PCT Pub. Date: Apr. 4, 2013

(65) Prior Publication Data
US 2014/0054580 A1    Feb. 27, 2014

(30) Foreign Application Priority Data

Sep. 26, 2011    (CN) .......................... 2011 1 0288858

(51) Int. Cl.
*H01L 21/00* (2006.01)
*H01L 29/66* (2006.01)
(Continued)

(52) U.S. Cl.
CPC ...... *H01L 29/66969* (2013.01); *H01L 27/1288* (2013.01); *H01L 29/66765* (2013.01); *H01L 29/7869* (2013.01)

(58) Field of Classification Search
USPC ..................................................... 438/34, 26
See application file for complete search history.

(56) References Cited

U.S. PATENT DOCUMENTS

| 6,337,284 | B1 | 1/2002 | Hwang et al. | |
| 8,460,956 | B2 * | 6/2013 | Hsieh | ............... 438/34 |

(Continued)

FOREIGN PATENT DOCUMENTS

| CN | 1462901 A | 12/2003 |
| CN | 101009248 A | 8/2007 |
| CN | 101416320 A | 4/2009 |
| CN | 201110288858.9 | * 9/2011 |
| CN | 102629576 A | 8/2012 |
| JP | 2003-179069 A | 6/2003 |

OTHER PUBLICATIONS

Second Chinese Office Action dated Mar. 25, 2014; Appln. No. 201110288858.9.

(Continued)

*Primary Examiner* — Yu-Hsi D Sun
*Assistant Examiner* — Grant Withers
(74) *Attorney, Agent, or Firm* — Ladas & Parry LLP (57) ABSTRACT

Embodiment of the present invention disclose an array substrate and a manufacturing method thereof, and the manufacturing method of an array substrate comprises the following steps: Step S1: a gate electrode metal layer, an insulating layer and an active layer are deposited successively on a substrate, and gate electrodes, gate lines and an active layer pattern are formed through a first mask process; Step S2: a protective layer is deposited on the substrate after completion of the step S1, and via-holes are formed in the protective layer through a second mask process; and Step S3: a pixel electrode layer and a source/drain electrode metal layer are deposited sequentially on the substrate after completion of the step S2, and source/drain electrodes, pixel electrodes and data lines are formed through a third mask process.

9 Claims, 6 Drawing Sheets

(51) Int. Cl.
*H01L 27/12* (2006.01)
*H01L 29/786* (2006.01)

(56) References Cited

U.S. PATENT DOCUMENTS

2001/0005596 A1   6/2001  Lee et al.
2001/0035527 A1  11/2001  Tanaka et al.
2009/0001374 A1   1/2009  Inoue et al.

OTHER PUBLICATIONS

First Chinese Office Action dated Jul. 30, 2013; Appln. No. 201110288858.9.
International Preliminary Report on Patentability dated Apr. 1, 2014; PCT/CN2012/081997.
Chinese Patent Office Rejection Decision dated Jul. 3, 2014; Appln. No. 201110288858.9.

* cited by examiner

ARRAY SUBSTRATE AND MANUFACTURING METHOD THEREOF

FIELD OF THE INVENTION

Embodiments of the present invention relate to an array substrate and a manufacturing method thereof.

BACKGROUND OF THE INVENTION

Thin Film Transistor Liquid Crystal Displays (TFT-LCDs) occupy a dominant position in the current flat panel display market because of the features of small volume, low power consumption and no radiation, etc. For a TFT-LCD, an array substrate and a manufacturing method thereof determine the performance, yield and price of a product. In order to effectively reduce the production cost of the TFT-LCD and improve the yield, the manufacturing process of the array substrate of the TFT-LCD is gradually simplified, and it has been developed from seven mask (7 mask) processes at the beginning to four mask (4 mask) processes on a basis of a slit photolithography technique.

The 4 mask processes adopted for manufacturing an array substrate in the prior art mainly comprise the following steps: Step S11, Gate electrodes and gate lines are formed on a substrate; Step S12, an insulating layer is deposited on the gate electrodes and the gate lines; Step S13, an active layer is deposited on the insulating layer; Step S14, a source/drain electrode layer is deposited on the active layer; Step S15, a PVX protective layer is deposited on the source/drain electrode layer, and via-holes are formed in the protective layer; Step S16, finally, an ITO (Indium Tin Oxide) conductive layer is formed on the protective layer. Since the formations of the gate electrodes, the source/drain electrode layer, the via-holes, and the ITO conductive layer all require mask process, the manufacturing of an array substrate in the prior art needs four mask processes in total. The step S11 utilizing one mask process to form the gate electrodes and the gate lines makes sequent processes complicated, and the performance of the array substrate manufactured is hard to be guaranteed. On the other hand, the insulating layer in the prior art has a thickness of 400 nm, which is relatively thick, and which results in a relatively long charging time of the TFT. The protective layer has a thickness of 250 nm, which is relatively thin, and which results in a relative large capacitance between the data lines and the gate lines and is liable to generate a parasitic capacitance (CgS), causing crosstalk phenomenon to occur between the source/drain electrodes and the gates, and affecting the display quality.

SUMMARY OF THE INVENTION

Embodiments of the present invention can simplify the manufacturing process of an array substrate, reduce the cost, and ensure its better performance.

In one aspect of the embodiments of the present invention, there is provided a manufacturing method of an array substrate, and the manufacturing method comprises the following steps: Step S1: a gate electrode metal layer, an insulating layer and an active layer are deposited successively on a substrate, and gate electrodes, gate lines and an active layer pattern are formed through a first mask process; Step S2: a protective layer is deposited on the substrate after completion of the step S1, and via-holes are formed in the protective layer through a second mask process; and Step S3: a pixel electrode layer and a source/drain electrode metal layer are deposited sequentially on the substrate after completion of the step S2, and source/drain electrodes, pixel electrodes and data lines are formed through a third mask process.

In another aspect of the embodiments of the present invention, there is provided an array substrate manufactured in accordance with the above-described manufacturing method of an array substrate, and the array substrate comprises: a substrate; gate electrodes, formed on the substrate; an insulating layer, formed on the gate electrodes; an active layer, formed on the insulating layer; a protective layer, formed on the substrate and via-holes is formed therein; pixel electrodes, formed on the protective layer and the active layer, and electrically connected with the active layer through the via-holes; and source/drain electrodes, formed on the pixel electrodes.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A First Embodiment

A first embodiment of the present invention provides a manufacturing method of an array substrate, which simplifies the manufacturing process of an array substrate, reduces the cost, and ensures that the manufactured array substrate has better performance.

As an example, the manufacturing method of the array substrate according to the first embodiment of the present invention adopts 3 mask processes to manufacture the array substrate. The manufacturing method of the array substrate according to the first embodiment of the present invention comprises the following steps:

Step S1: a gate electrode metal layer, an insulating layer and an active layer are deposited successively on a substrate, and gate electrodes, gate lines and an active layer pattern are formed through a first mask process;

Step S2: a protective layer is deposited on the substrate after completion of the step S1, and via-holes are formed in the protective layer through a second mask process;

Step S3: a pixel electrode layer and a source/drain electrode metal layer are deposited on the substrate after completion of the step S2, and pixel electrodes, source/drain electrodes, and data lines are formed through a third mask process.

An example of the step S1 is described as below.

The gate electrode metal layer is deposited on the substrate, a layer of SiNx or SiOx is deposited the insulating layer on the gate electrode metal layer, and an a-Si layer is deposited as the active layer on the insulating layer; next, a layer of photoresist is applied on the active layer; the photoresist is exposed with a half-tone or gray-tone mask, so that the photoresist is formed into a photoresist-fully-removed region, a photoresist-fully-retained region and a photoresist-partially-retained region, wherein the photoresist-fully-retained region corresponds to the region where the active layer pattern is located, the photoresist-partially-retained region corresponds to the region where the gate electrodes and the gate lines are located, and the photoresist-fully-removed region corresponds to the rest region; after a developing process, the photoresist thickness in the photoresist-fully-retained region is not changed, the photoresist in the photoresist-fully-removed region is completely removed, and the photoresist in the photoresist-partially-retained region is thinned; the a-Si layer is wet etched, then the insulating layer is dry etched, and then the gate electrode metal layer is wet etched, so that the gate electrodes and the gate lines are obtained; then, through an ashing process, the photoresist in the photoresist-partially-retained region is completely removed; and then the active layer pattern is formed by wet etching; finally, the remaining photoresist is stripped.

An example of the step S2 is described as below.

A layer of SiNx or SiOx is deposited as the protective layer on the substrate after completion of the step S, and the via-holes are formed on the active layer by utilizing the second mask process, and a contact layer of doped n-type amorphous silicon is formed on the exposed active layer.

An example of the step S3 is described as below.

The pixel electrode layer is deposited on the substrate after completion of the step S2, and the source/drain electrode metal layer is deposited on the pixel electrode layer; a layer of photoresist is applied on the source/drain electrode metal layer; the photoresist is exposed with a half-tone or gray-tone mask, so that the photoresist is formed into a photoresist-fully-removed region, a photoresist-fully-retained region and a photoresist-partially-retained region, wherein the photoresist-fully-retained region corresponds to the region where the source/drain electrodes and the data lines are located, the photoresist-partially-retained region corresponds to the region where the pixel electrodes are located, and the photoresist-fully-removed region corresponds to the rest region; after a developing process, the photoresist thickness in the photoresist-fully-retained region is not changed, the photoresist in the photoresist-fully-removed region is completely removed, and the photoresist in the photoresist-partially-retained region is thinned; the pixel electrode layer and the source/drain electrode metal layer in the photoresist-fully-removed region are removed by wet etching, so that the pixel electrodes are formed; by aching the photoresist, the photoresist in the photoresist-partially-retained region is removed off; and by wet etching, the source/drain electrodes and the data lines are formed; finally, the remaining photoresist is stripped off.

The insulating layer has a thickness of 200 nm-400 nm, and the protective layer has a thickness of 250 nm-400 nm.

Below, in connection with FIGS. 1a-1f, the manufacturing method of the array substrate according to the first embodiment of the present invention is described in detail.

Figure 1A:
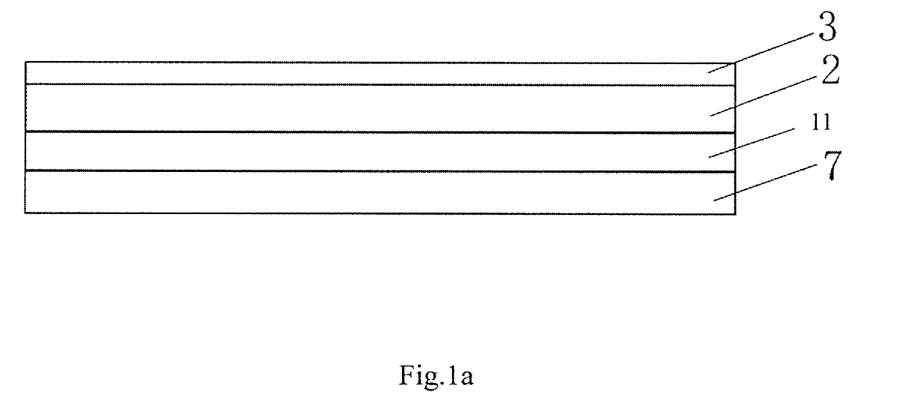
FIGS. 1a-1f are schematic views illustrating a manufacture procedure of an array substrate according to a first embodiment of the present invention.

The manufacturing method of the array substrate according to the first embodiment of the present invention comprises the following steps:

Step S21: a gate electrode metal layer 11, an insulating layer 2 and an active layer 3 are deposited successively on a substrate 7, and gate electrodes 1, gate lines and an active layer pattern are formed through a first mask process.

Specifically, as shown in FIG. 1a, the gate electrode metal layer 11 having a thickness between 200 nm-400 nm is deposited on the substrate 7 by using a magnetron sputtering process for forming the gate electrodes 1, and the metal used to the gate electrodes 1 may be Mo, Cu, Al and the like; then, a layer of SiNx or SiOx having a thickness between 200 nm-400 nm is deposited as the insulating layer 2 on the gate electrode metal layer 11, by using a Plasma Enhanced Chemical Vapor Deposition (PECVD) method; and then, the active layer 3 having a thickness between 100 nm-200 nm is deposited on the insulating layer 2, and the material of the active layer 3 may select a-Si.

Figure 1A:
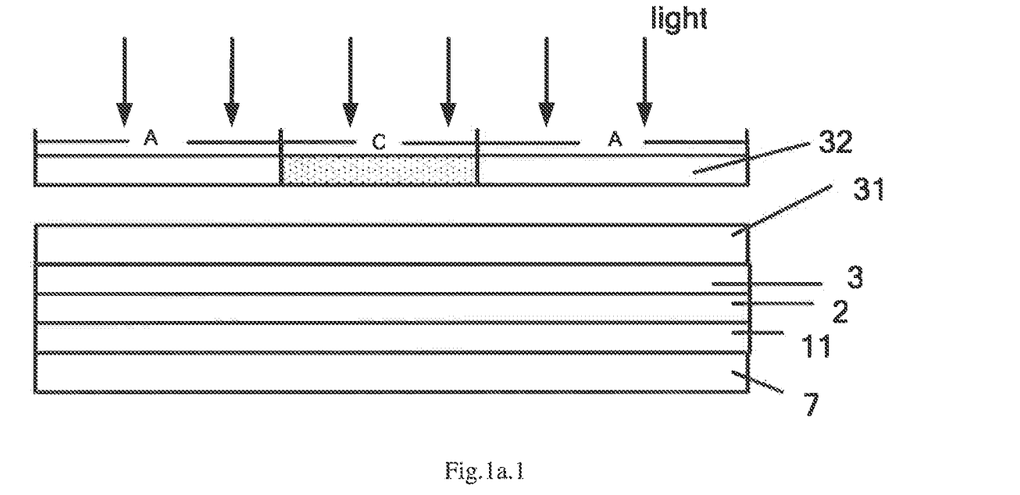
Figure 1A:
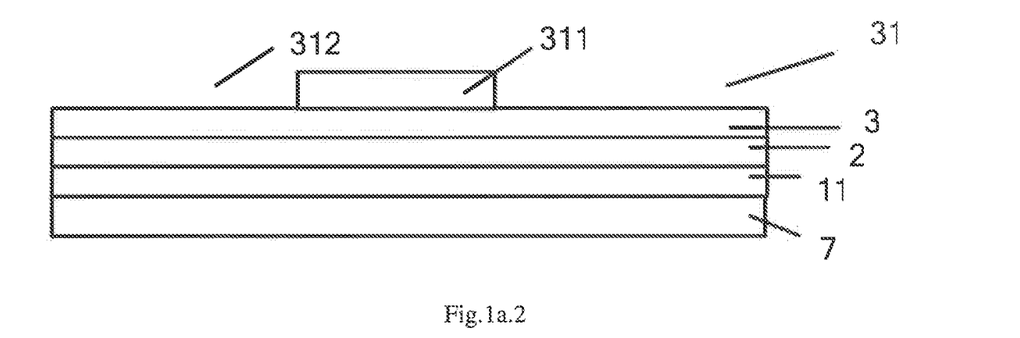
Figure 1B:
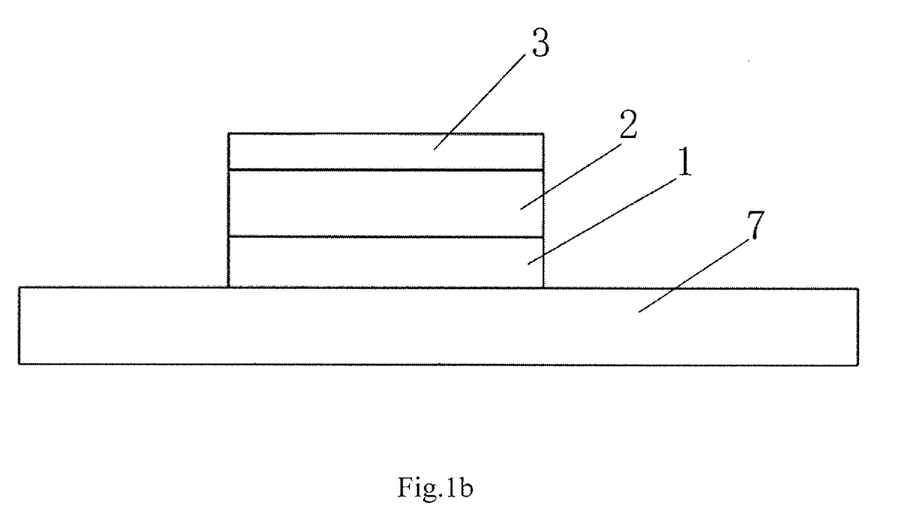

Next, as shown in FIG. 1a.1, FIG. 1a.2 and FIG. 1b, the gate electrodes 1, the gate lines and the active layer pattern are formed by utilizing the first mask process: a layer of photoresist 31 is applied on the active layer 3; the photoresist is exposed with a half-tone or gray-tone mask 32 comprising a complete light-shielding region C and a complete light-transmitting region A and a partially light-shielding region B (not shown in figures), so that the photoresist is formed into a photoresist-fully-removed region 312, a photoresist-fully-retained region 311 and a photoresist-partially-retained region, wherein the photoresist-fully-retained region 311 corresponds to the region where the active layer pattern is located, the photoresist-partially-retained region corresponds to the region where the gate electrodes 1 and the gate lines are located, and the photoresist-fully-removed region 312 corresponds to the rest region; after a developing process, the photoresist thickness in the photoresist-fully-retained region is not changed, the photoresist in the photoresist-fully-removed region is completely removed, and the photoresist in the photoresist-partially-retained region is thinned; the active layer 3 is wet etched at first, then the insulating layer 2 is dry etched, and then the gate electrode metal layer 11 is wet etched, so that the gate electrodes 1 and the gate lines are obtained; then through an asking process, the photoresist (PR) in the photoresist-partially-retained region is completely removed off; and through a wet etching process, the active layer pattern is formed; finally, the remaining photoresist is stripped off.

Figure 1C:
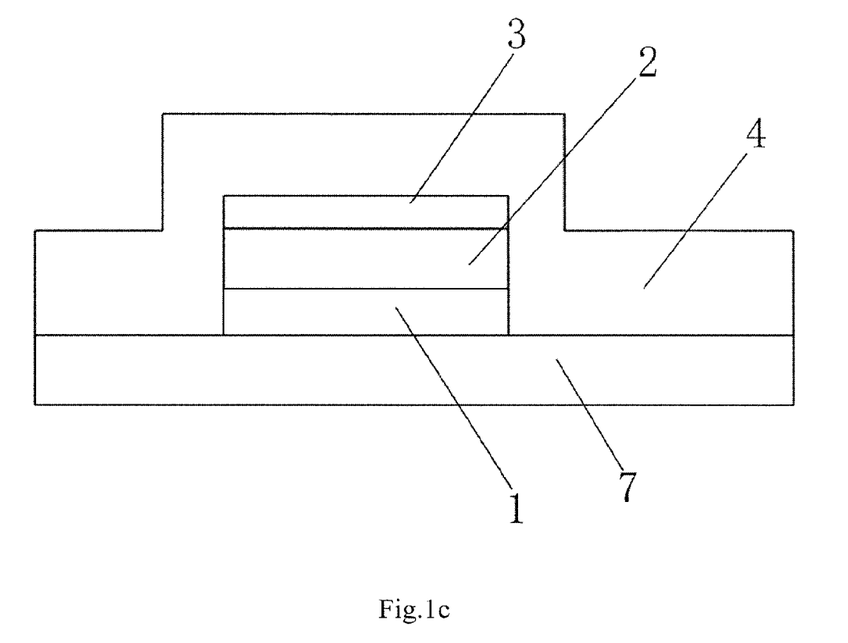
Figure 1D:
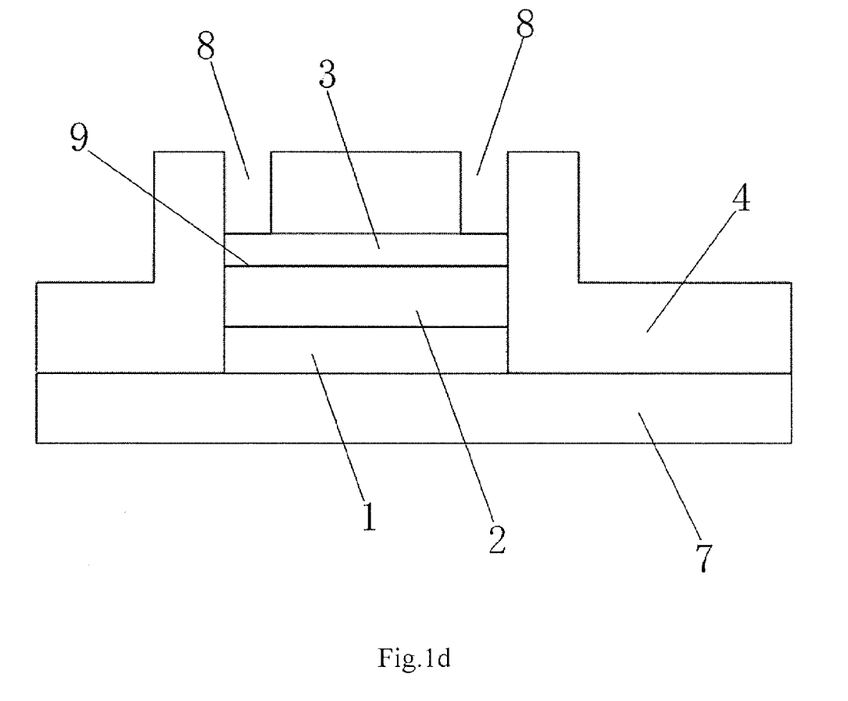

Step S22: a protective layer 4 is deposited on the substrate 7 after completion of the step S21, and via-holes 8 are formed in the protective layer 4 through a second mask process.

As shown in FIG. 1c, a layer of SiNx or SiOx having a thickness between 250 nm-400 nm is deposited as the protective layer 4 on the substrate 7 after completion of the step S21 by using a PECVD; as shown in FIG. 1d, by utilizing a second mask process, the via-holes 8 are formed on the active layer 3, so that the active layer 3 is connected to one of source/drain electrodes 6 formed later, and TFT channels 9 are formed; after formation of the via-holes 8, a contact layer (not shown) of doped n-type amorphous silicon (n+) is formed on the exposed active layer 3, so that an ohmic contact can be formed between the active layer 3 and one of the source/drain electrodes 6 formed later.

Figure 1E:
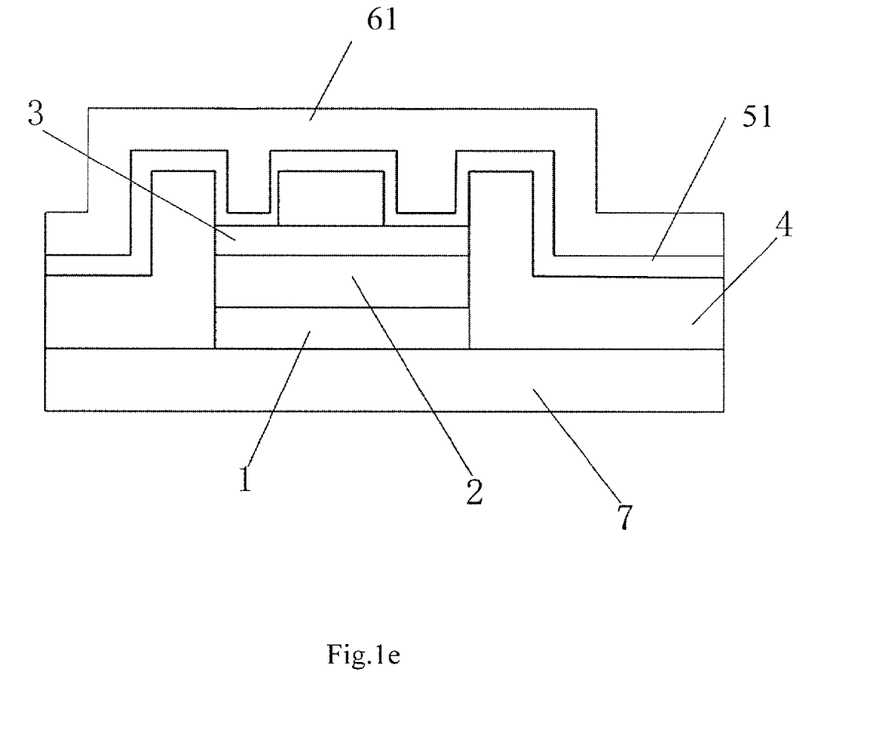
Figure 1E:
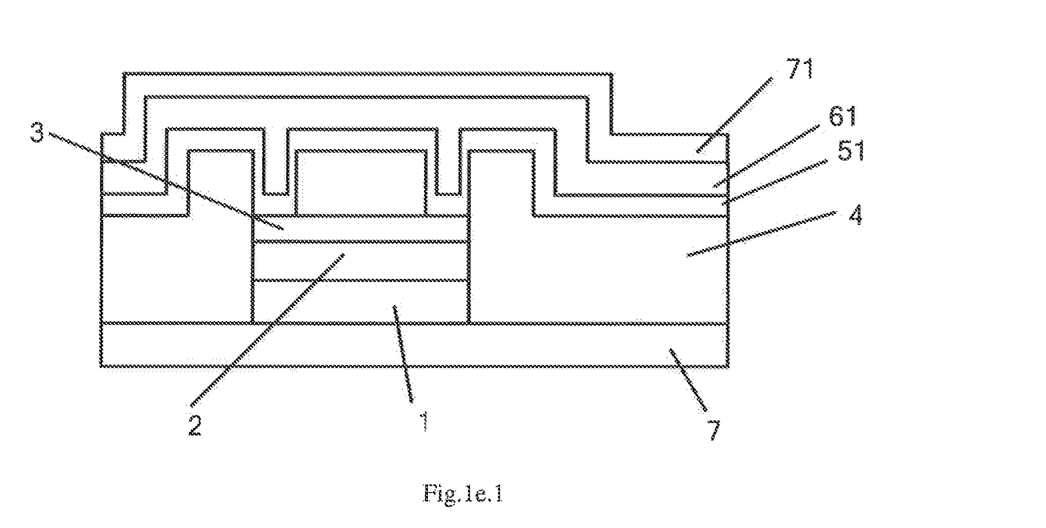
Figure 1E:
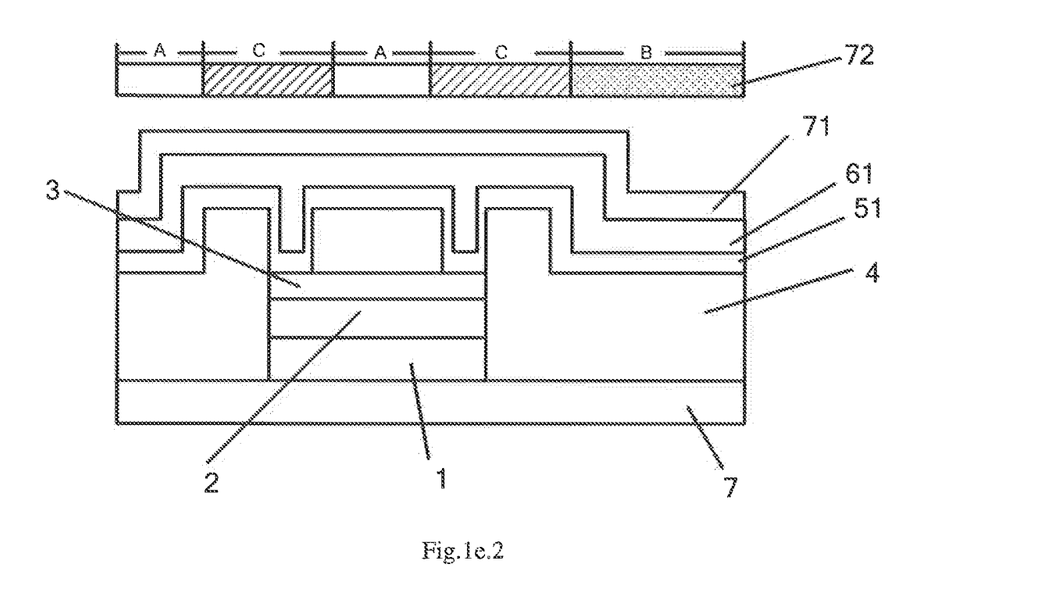
Figure 1E:
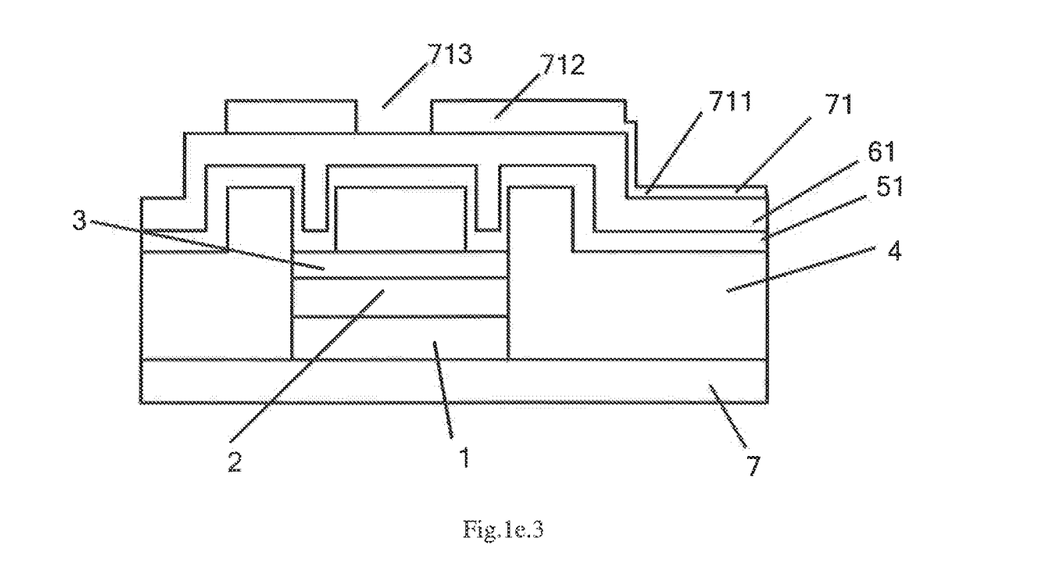
Figure 1E:
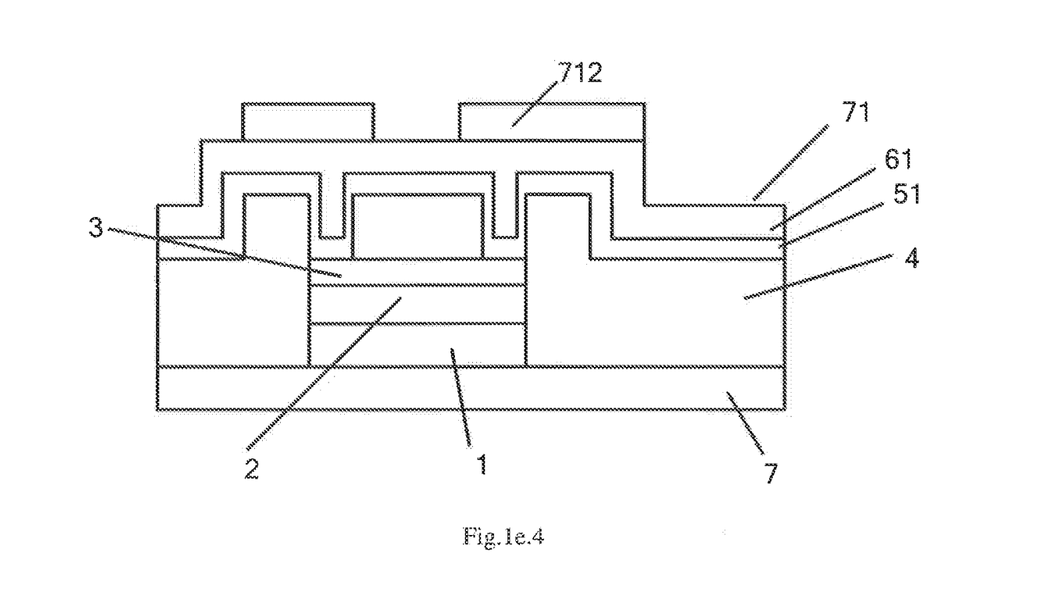

Step S23: a pixel electrode layer 51 and a source/drain electrode metal layer 61 are deposited on the substrate 7 after completion of the step S22, and the source/drain electrodes 6, data lines and pixel electrodes 5 are formed through a third mask process.

Specifically, as shown in FIG. 1e, an ITO layer 51 having a thickness between 40 nm-100 nm is deposited on the substrate 7 after completion the step S22 by using a magnetron sputtering process, for forming the pixel electrodes 5; successively, a source/drain electrode metal layer 61 having a thickness between 200 nm-400 nm is deposited, for forming the source/drain electrodes 6.

Figure 1F:
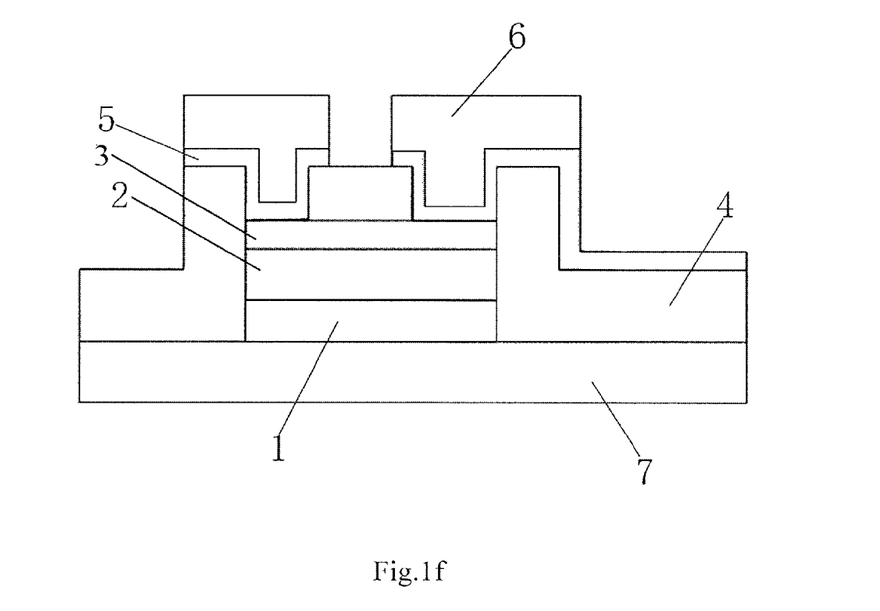

As shown in FIG. 1e.1, FIG. 1e.2, FIG. 1e.3, FIG. 1e.4 and FIG. 1f, the source/drain electrodes 6, the data lines and the pixel electrodes 5 are formed by utilizing the third mask process: a layer of photoresist 71 is applied on the source/drain electrode metal layer 61; the photoresist 71 is exposed with a half-tone or gray-tone mask 72 comprising a complete light-shielding region C, a complete light-transmitting region A and a partially light-shielding region B, so that the photoresist 71 is formed into a photoresist-fully-removed region 713, a photoresist-fully-retained region 712 and a photoresist-partially-retained region 711, wherein the photoresist-fully-retained region 712 corresponds to the region where the source/drain electrodes 6 and the data lines are located, the photoresist-partially-retained region 711 corresponds to the region where the pixel electrodes 5 is located, and the photoresist-fully-removed region 713 corresponds to the rest region; after a developing process, the photoresist thickness in the photoresist-fully-retained region 712 is not changed, the photoresist in the photoresist-fully-removed region 713 is completely removed, and the photoresist in the photoresist-partially-retained region 711 is thinned; by wet etching, the ITO layer 51 and the source/drain electrode metal layer 61 in the photoresist-fully-removed region 713 are removed, so that the pixel electrodes 5 are formed; by ashing the photoresist, the photoresist in the photoresist-partially-retained region 711 is removed off; and by wet etching, the source/drain electrodes 6 and the data lines are formed; finally, the remaining photoresist is stripped off.

According to the embodiment of the present invention, by making the gate electrode metal layer, the insulating layer and the active layer deposited along and subjected to the photolithography, one mask process is saved, so that the manufacturing of the array substrate can be accomplished only through three mask processes, and the manufacture cost is reduced; by reducing the thickness of the insulating layer 2, the charging current Ion upon turning on the TFT can be increased, thus the charging time is shortened; and by increasing the thickness of the protective layer 4, the capacitance between the data lines and the gate lines can be reduced, thus the purpose of eliminating the parasitic capacitance is achieved, thereby avoiding crosstalk phenomenon occurring, and ensuring the display quality.

A Second Embodiment

A manufacturing method of an array substrate according to the second embodiment of the present invention uses third mask processes to manufacture the array substrate. The manufacturing method of the array substrate according to the second embodiment of the present invention comprises the following steps:

Step S1: a gate electrode metal layer, an insulating layer and an active layer are deposited successively on a substrate, and gate electrodes, gate lines and an active layer pattern are formed through a first mask process;

Step S2: a protective layer is deposited on the substrate after completion of the step S1, and via-holes are formed in the protective layer through a second mask process;

Step S3: a pixel electrode layer and a source/drain electrode metal layer are deposited on the substrate after completion of the step S2, and pixel electrodes, source/drain electrodes, and data lines are formed through a third mask process.

An example of the step S1 is described as below.

The gate electrode metal layer is deposited on the substrate, a layer of SiNx or SiOx is deposited as the insulating layer on the gate electrode metal layer, and a metal oxide layer is deposited as the active layer on the insulating layer; next, a layer of photoresist is applied on the active layer; the photoresist is exposed with a half-tone or gray-tone mask, so that the photoresist is formed into a photoresist-fully-removed region, a photoresist-fully-retained region and a photoresist-partially-retained region, wherein the photoresist-fully-retained region corresponds to the region where the active layer pattern is located, the photoresist-partially-retained region corresponds to the region where the gate electrodes and the gate lines are located, and the photoresist-fully-removed region corresponds to the rest region; after a developing process, the photoresist thickness in the photoresist-fully-retained region is not changed, the photoresist in the photoresist-fully-removed region is completely removed, and the photoresist in the photoresist-partially-retained region is thinned; the metal oxide layer and the insulating layer are dry etched, then the gate electrode metal layer is wet etched, so that the gate electrodes and the gate lines are obtained; then, through an ashing process, the photoresist in the photoresist-partially-retained region is completely removed off; and by dry etching, the active layer pattern is formed; finally, the remaining photoresist is stripped off.

The metal oxide comprises zinc oxide, indium-gallium-zinc oxide, and a mixture thereof.

Further, an example of the step S2 is described as below.

A layer of SiNx or SiOx is deposited as the protective layer on the substrate after completion of the step S1, and the via-holes are fainted on the active layer by utilizing a second mask process.

An example of the step S3 is described as below.

The pixel electrode layer is deposited on the substrate after completion of the step S2, and the source/drain electrode metal layer is deposited on the pixel electrode layer; a layer of photoresist is applied on the source/drain electrode metal layer; the photoresist is exposed with a half-tone or gray-tone mask, so that the photoresist is formed into a photoresist-fully-removed region, a photoresist-fully-retained region and a photoresist-partially-retained region, wherein the photoresist-fully-retained region corresponds to the region where the source/drain electrodes and the data lines are located, the photoresist-partially-retained region corresponds to the region where the pixel electrodes are located, and the photoresist-fully-removed region corresponds to the rest region; after a developing process, the photoresist thickness in the photoresist-fully-retained region is not changed, the photoresist in the photoresist-fully-removed region is completely removed, and the photoresist in the photoresist-partially-retained region is thinned; the pixel electrode layer and the source/drain electrode metal layer in the photoresist-fully-removed region are removed by wet etching, so that the pixel electrodes are formed; by ashing the photoresist, the photoresist in the photoresist-partially-retained region is removed off; and by wet etching, the source/drain electrodes and the data lines are formed; finally, the remaining photoresist is stripped off.

The insulating layer has a thickness of 200 nm-400 nm, and the protective layer has a thickness of 250 nm-400 nm.

Below, the manufacturing method of the array substrate according to the second embodiment of the present invention is described in detail.

The manufacturing method of the array substrate according to the second embodiment of the present invention comprises the following steps:

Step S31: a gate electrode metal layer 11, an insulating layer 2 and an active layer 3 are deposited successively on a substrate 7, and gate electrodes 1, gate lines and an active layer pattern are formed through a first mask process;

Specifically, the gate electrode metal layer 11 having a thickness between 200 nm-400 nm is deposited on the substrate 7, by using a magnetron sputtering process, for forming the gate electrodes 1, and the metal may be Mo, Cu, Al and the like; then, by using a PECVD, a layer of SiNx or SiOx having a thickness between 200 nm-400 nm is deposited as the insulating layer 2, and a metal oxide layer having a thickness between 30 nm-50 nm is deposited as the active layer 3, and the material of the active layer 3 may be ZnO, indium-gallium-zinc oxide (IGZO), a mixture of doped zinc oxide and indium oxide, other metal oxides and the like.

Next, the gate electrodes 1, the gate lines and the active layer pattern are formed by utilizing the first mask process: a layer of photoresist is applied on the active layer; the photoresist is exposed with a half-tone or gray-tone mask, so that the photoresist is formed into a photoresist-fully-removed region, a photoresist-fully-retained region and a photoresist-partially-retained region, wherein the photoresist-fully-retained region corresponds to the region where the active layer pattern is located, the photoresist-partially-retained region corresponds to the region where the gate electrodes 1 and the gate lines are located, and the photoresist-fully-removed region corresponds to the rest region; after a developing process, the photoresist thickness in the photoresist-fully-retained region is not changed, the photoresist in the photoresist-fully-removed region is completely removed, and the photoresist in the photoresist-partially-retained region is thinned; the active layer 3 and the insulating layer 2 are dry etched at first; then by wet etching, the gate electrodes 1 and the gate lines are formed; and then the photoresist is subject to an ashing process, thereafter by dry etching, the active layer pattern is formed.

Step S32: a protective layer 4 is deposited on the substrate 7 after completion of the step S31, and via-holes 8 are formed through a second mask process;

A layer of SiNx or SiOx having a thickness between 250 nm-400 nm is deposited as the protective layer 4 on the substrate 7 after completion of the step S31, by using a PECVD; by utilizing the second mask process, the via-holes 8 are formed on the active layer 3, so that the active layer 3 is connected to one of source/drain electrodes 6, and TFT channels 9 are formed.

Step S33: a pixel electrode layer 51 and a source/drain electrode metal layer 61 are deposited on the substrate 7 after completion of the step S32, and the source/drain electrodes 6, data lines and pixel electrodes 5 are formed through a third mask process;

Specifically, an ITO layer 51 having a thickness between 40 nm-100 nm is deposited on the substrate 7 after completion the step S32, by using a magnetron sputtering process, for forming the pixel electrodes 5; successively, the source/drain electrode metal layer 61 having a thickness between 200 nm-400 nm is deposited for forming the source/drain electrodes 6.

By utilizing the third mask process, the source/drain electrodes 6, the data lines and the pixel electrodes 5 are formed: a layer of photoresist is applied on the source/drain electrode metal layer 61; the photoresist is exposed with a half-tone or gray-tone mask, so that the photoresist is formed into a photoresist-fully-removed region, a photoresist-fully-retained region and a photoresist-partially-retained region, wherein the photoresist-fully-retained region corresponds to the region where the source/drain electrodes 6 and the data lines are located, the photoresist-partially-retained region corresponds to the region where the pixel electrodes 5 are located, and the photoresist-fully-removed region corresponds to the rest region; after a developing process, the photoresist thickness in the photoresist-fully-retained region is not changed, the photoresist in the photoresist-fully-removed region is completely removed, and the photoresist in the photoresist-partially-retained region is thinned; by wet etching, the ITO layer 51 and the source/drain electrode metal layer 61 in the photoresist-fully-removed region are removed; and by wet etching, the pixel electrodes 5 are formed; finally, the remaining photoresist is stripped off.

According to the embodiment of the present invention, by making the gate electrode metal layer, the insulating layer and the active layer deposited along and subjected to a photolithography, one mask process is saved, so that the manufacturing of the array substrate can be accomplished only through three mask processes, and the manufacturing cost is reduced; by reducing the thickness of the insulating layer 2, the charging current Ion upon turning on the TFT can be increased, thus the charging time is shortened; and by increasing the thickness of the protective layer 4, the capacitance between the data lines and the gate lines can be reduced, thus the purpose of eliminating the parasitic capacitance is achieved, thereby avoiding crosstalk phenomenon occurring, and ensuring the display quality.

A Third Embodiment

As shown in FIG. 1f, it is a schematic structural view of an array substrate provided by the third embodiment of the present invention. The array substrate according to the third embodiment of the present invention is manufactured in accordance with the method in any of the above-mentioned embodiments, and the array substrate comprises:

A substrate 7; gate electrodes 1, formed on the substrate 7; an insulating layer 2, formed on the gate electrodes 1; an active layer 3, formed on the insulating layer 2; a protective layer 4, formed on the substrate 7 having the gate electrodes 1; pixel electrodes 5, formed on the protective layer 4 and the active layer 3; and source/drain electrodes 6, formed on the pixel electrodes 5, wherein the ends of the pixel electrodes 5 and the source/drain electrodes 6 over the channels are connected to the active layer 3 through the via-holes 8 in the protective layer 4.

It can be seen from the above embodiment that, according to the embodiment of the invention, by making the gate electrodes, the insulating layer and the active layer deposited along and subjected to photolithography, one mask process is saved, so that the manufacturing of the array substrate can be accomplished only through three mask processes, and the manufacturing cost is reduced; further, by reducing the thickness of the insulating layer, the charging current of the TFT can be increased, thus the charging time is shortened; and by increasing the thickness of the protective layer, the capacitance between the data lines and the gate lines can be reduced, thus the parasitic capacitance is effectively eliminated, thereby ensuring the display quality and optimizing the performance of the array substrate.

The above description is merely the preferred implementations of the present invention. It should be noted that, for the ordinary skilled in the art, improvements and modifications can be made without departing from the principles of the present invention, also these improvements and modifications should be regarded as within the scope of the invention.

The invention claimed is:

1. A manufacturing method of an array substrate, comprising the following steps:

Step S1: depositing a gate electrode metal layer, an insulating layer and an active layer successively on a substrate, and forming gate electrodes, gate lines and an active layer pattern through a first mask process;

Step S2: depositing a protective layer on the substrate after completion of the step S1 and forming via-holes in the protective layer through a second mask process; and Step S3: depositing a pixel electrode layer and a source/drain electrode metal layer sequentially on the substrate after completion of the step S2, and forming source/drain electrodes, pixel electrodes and data lines through a third mask process.

2. The manufacturing method of an array substrate according to claim 1, wherein the step S1 comprises:

depositing the gate electrode metal layer on the substrate, depositing a layer of SiNx or SiOx as the insulating layer on the gate electrode metal layer, and depositing an a-Si layer as the active layer on the insulating layer;

Next, applying a layer of photoresist on the active layer; exposing the photoresist with a half-tone or gray-tone mask, so that the photoresist is formed into a photoresist-fully-removed region, a photoresist-fully-retained region and a photoresist-partially-retained region, wherein the photoresist-fully-retained region corresponds to the region where the active layer pattern is located, the photoresist-partially-retained region corresponds to the region where the gate electrodes and the gate lines are located, and the photoresist-fully-removed region corresponds to the rest region, and after a developing process, the photoresist thickness in the photoresist-fully-retained region is not changed, the photoresist in the photoresist-fully-removed region is completely removed, and the photoresist in the photoresist-partially-retained region is thinned;

wet-etching the active layer, then dry etching the insulating layer, and then wet-etching the gate electrode metal layer, so that the gate electrodes and the gate lines are obtained;

then, ashing the photoresist and completely removing off, the photoresist in the photoresist-partially-retained region and forming the active layer pattern through a wet etching process;

finally, stripping a remaining photoresist.

3. The manufacturing method of an array substrate according to claim 1, wherein the step S2 comprises:

depositing a layer of SiNx or SiOx as the protective layer on the substrate after completion of the step S1, and forming the via-holes on the active layer by utilizing the second mask process, and forming a contact layer of doped n-type amorphous silicon on the exposed active layer.

4. The manufacturing method of an array substrate according to claim 1, wherein the step S3 comprises:

depositing the pixel electrode layer on the substrate after completion of the step S2, and depositing the source/drain electrode metal layer on the pixel electrode layer;

applying a layer of photoresist on the source/drain electrode metal layer;

exposing the photoresist with a half-tone or gray-tone mask, so that the photoresist is formed into a photoresist-fully-removed region, a photoresist-fully-retained region and a photoresist-partially-retained region, wherein the photoresist-fully-retained region corresponds to the region where the source/drain electrodes and the data lines are located, the photoresist-partially-retained region corresponds to the region where the pixel electrodes are located, and the photoresist-fully-removed region corresponds to the rest region, and after a developing process, the photoresist thickness in the photoresist-fully-retained region is not changed, the photoresist in the photoresist-fully-removed region is completely removed, and the photoresist in the photoresist-partially-retained region is thinned;

removing the pixel electrode layer and the source/drain electrode metal layer in the photoresist-fully-removed region by wet etching, so that the pixel electrodes are formed;

ashing the photoresist and removing off the photoresist in the photoresist-partially-retained region, and by wet etching, the source/drain electrodes and the data lines are formed;

finally, stripping off the remaining photoresist.

5. The manufacturing method of an array substrate according to claim 1, wherein the step S1 comprises:

depositing the gate electrode metal layer on the substrate, depositing a layer of SiNx or SiOx as the insulating layer on the gate electrode metal layer, and depositing a metal oxide layer as the active layer on the insulating layer;

next, applying a layer of photoresist on the active layer; exposing the photoresist with a half-tone or gray-tone mask, so that the photoresist is formed into a photoresist-fully-removed region, a photoresist-fully-retained region and a photoresist-partially-retained region, wherein the photoresist-fully-retained region corresponds to the region where the active layer pattern is located, the photoresist-partially-retained region corresponds to the region where the gate electrodes and the gate lines are located, and the photoresist-fully-removed region corresponds to the rest region, and after a developing process, the photoresist thickness in the photoresist-fully-retained region is not changed, the photoresist in the photoresist-fully-removed region is completely removed, and the photoresist in the photoresist-partially-retained region is thinned;

next, dry-etching the metal oxide layer and the insulating layer, and then wet-etching the gate electrode metal layer, so that the gate electrode and the gate-lines are obtained;

then, ashing the photoresist and completely removing off the photoresist in the photoresist-partially-retained region, and then by dry etching, the active layer pattern is formed;

finally, stripping off the remaining photoresist.

6. The manufacturing method of an array substrate according to claim 5, wherein the metal oxide comprises zinc oxide, indium-gallium-zinc oxide, or a mixture thereof.

7. The manufacturing method of an array substrate according to claim 5, wherein the step S2 comprises:

depositing a layer of SiNx or SiOx as the protective layer on the substrate after completion of the step S1, and forming the via-holes on the active layer by utilizing the second mask process.

8. The manufacturing method of an array substrate according to claim 5, wherein the step S3 comprises:

depositing the pixel electrode layer on the substrate after completion of the step S2, and depositing the source/drain electrode metal layer on the pixel electrode layer;

applying a layer of photoresist on the source/drain electrode metal layer;

exposing the photoresist with a half-tone or gray-tone mask, so that the photoresist is formed into a photoresistfully-removed region, a photoresist-fully-retained region and a photoresist-partially-retained region, wherein the photoresist-fully-retained region corresponds to the region where the source/drain electrodes and the data lines are located, the photoresist-partially-retained region corresponds to the region where the pixel electrodes are located, and the photoresist-fully-removed region corresponds to the rest region, and after a developing process, the photoresist thickness in the photoresist-fully-retained region is not changed, the photoresist in the photoresist-fully-removed region is completely removed, and the photoresist in the photoresist-partially-retained region is thinned;

removing the pixel electrode layer and the source/drain electrode metal layer in the photoresist-fully-removed region by wet etching, so that the pixel electrodes are formed;

aching the photoresist and removing off the photoresist in the photoresist-partially-retained region, and by wet etching, the source/drain electrodes and the data lines are formed;

finally, stripping off the remaining photoresist.

9. The manufacturing method of an array substrate according to claim 1, wherein the insulating layer has a thickness of 200 nm-400 nm, and the protective layer has a thickness of 250 nm-400 nm.

* * * * *